United States Patent
Godbersen et al.

(10) Patent No.: US 11,637,517 B2
(45) Date of Patent: Apr. 25, 2023

(54) METHOD AND DEVICE FOR ESTIMATING INDIVIDUAL PHASE RESISTANCE OF AN ELECTRIC MOTOR

(71) Applicant: Danfoss Power Electronics A/S, Gråsten (DK)

(72) Inventors: Jens Godbersen, Sønderborg (DK); Lucian Asiminoaei, Gråsten (DK)

(73) Assignee: Danfoss Power Electronics A/S, Gråsten (DK)

(*) Notice: Subject to any disclaimer, the term of this patent is extended or adjusted under 35 U.S.C. 154(b) by 49 days.

(21) Appl. No.: 17/367,814

(22) Filed: Jul. 6, 2021

(65) Prior Publication Data

US 2022/0014135 A1 Jan. 13, 2022

(30) Foreign Application Priority Data

Jul. 7, 2020 (DE) .......................... 102020117906.5

(51) Int. Cl.
  *H02P 21/16* (2016.01)
  *G01R 31/34* (2020.01)

(52) U.S. Cl.
  CPC ............ *H02P 21/16* (2016.02); *G01R 31/343* (2013.01)

(58) Field of Classification Search
  CPC .......... H02P 21/16; H02P 6/08; H02P 29/024; H02P 29/032; G01R 31/343
  USPC ....................................... 318/400.01, 400.02
  See application file for complete search history.

(56) References Cited

U.S. PATENT DOCUMENTS

| 8,384,338 B2 * | 2/2013 | Lu .......................... H02P 21/16 |
| | | 702/183 |
| 9,413,282 B2 * | 8/2016 | Magee ..................... H02P 21/24 |
| 10,333,374 B2 * | 6/2019 | Sullivan ................. H01B 19/04 |
| 2003/0001537 A1 | 1/2003 | Yang et al. |
| 2014/0265990 A1 | 9/2014 | Chretien et al. |

* cited by examiner

*Primary Examiner* — David Luo
(74) *Attorney, Agent, or Firm* — McCormick, Paulding & Huber PLLC

(57) ABSTRACT

The present invention relates to a method for estimating individual phase resistance of a motor by means of an adjustable speed drive (ASD) while the motor controlled by the ASD is running and/or is at standstill. The motor is an asynchronous motor or a synchronous motor. The invention also relates to an adjustable speed drive for executing a corresponding method.

19 Claims, 7 Drawing Sheets

20

20

METHOD AND DEVICE FOR ESTIMATING INDIVIDUAL PHASE RESISTANCE OF AN ELECTRIC MOTOR

CROSS-REFERENCE TO RELATED APPLICATION

This application claims foreign priority benefits under 35 U.S.C. § 119 to German Patent Application No. 102020117906.5 filed on Jul. 7, 2020, the content of which is hereby incorporated by reference in its entirety.

TECHNICAL FIELD

The present invention relates to a method for estimating individual phase resistance of a motor by means of an adjustable speed drive (ASD) while the motor controlled by the ASD is running and/or is at standstill. The motor is an asynchronous motor or a synchronous motor. The invention also relates to an adjustable speed drive for executing a corresponding method.

BACKGROUND

From the state of the art, various methods for online identification of motor resistance are known. Most of the known methods comprise injecting a current into the motor, measuring the effect of this injection and estimating the symmetrical motor resistance based on the measured effect. The term "online identification" may presently relate to identification of motor resistance in a state, in which the motor is mounted to some device and may provide driving power to said device. Alternatively or additionally, the term "online identification" may relate to remote identification of motor resistance via e.g. the internet or some other remote connection.

One major problem associated with the known methods of identification of motor resistance is that the classical symmetrical detection of motor resistance cannot identify the individual phase resistance, but only an equivalent average value.

SUMMARY

In order to overcome this problem, the present invention offers a way of measuring the asymmetrical motor resistance according to the method described in claim 1. Advantageous embodiments of the invention are described in the dependent claims. The invention is also directed at an adjustable speed drive for controlling a motor, said adjustable speed drive being adapted for executing a corresponding method.

According to the invention, a method is provided for estimating individual phase resistance of a motor by means of an adjustable speed drive (ASD), while the motor controlled by the ASD is running and/or is at standstill. The motor may be an asynchronous motor or a synchronous motor. The method comprises the steps of:
- injecting at least two DC currents in the motor as an ASD output,
- determining the output voltages and currents resulting from injecting the DC currents,
- extracting DC components present in the determined output voltages and currents, and
- calculating the cumulated output resistance Rs seen by the ASD on each phase of the motor individually.

The proposed idea improves the main function of the adjustable speed drive to control the motor. By knowing the unbalance in the output resistance, the control and stability of the drive improves, especially for high performance applications, where torque and speed performance are important.

The extraction of DC components in the determined output voltages and currents (i.e. the DC voltage and DC current) allows determination of the DC stator resistance seen by the ASD, combining resistances of connection cables and the motor.

The injection of the DC currents may occur at least two times and at different phase angles, e.g. at 0° and 120°. The injection may occur at different moments in time and/or may be aligned with different phases of the motor as an ASD output. The method may be used during standstill of the motor or while the motor is running. Usually numerous DC current injections may be carried out at two or more distinct phase angles. This allows collection of enough datasets to solve the identification of the resistance on each phase separately.

Based on the knowledge of the resistance Rs on each phase of the motor and therefore the asymmetrical resistance of the motor, new features and embodiments may be deployed in the context of the present invention, some examples of which will be described in the following paragraphs.

In a preferred embodiment of the invention, the determined output voltages and/or currents are either measured or estimated.

In a further preferred embodiment of the invention, the injected DC currents are synchronized with different phase angles of a fundamental output current of the ASD.

The phase angles may not be identical and they may vary. The calculation of the individual phase resistance (or asymmetrical resistance) seen by the ASD may be done after collecting the measurement data of at least two different phase angles.

In a preferred embodiment of the invention, the DC currents are injected in a discontinuous manner, for a limited injection period followed by a waiting period until next DC current injection.

In a preferred embodiment of the invention, the duration of both injection and waiting period may be variable and synchronized with the speed of the motor. This embodiment clearly only applies in situations in which the motor is running.

In a preferred embodiment of the invention, the injection of the DC current is stopped if the ASD is not in a safe operation conditions. An unsafe operation condition may be defined to include faults, trips, reaching limitations and/or various deratings of the motor and/or of the ASD.

In a preferred embodiment of the invention, the injection of the DC current is stopped if the ASD operates in excessively dynamic conditions that affect the extraction of the DC components present in the determined output currents and voltages.

In a preferred embodiment of the invention, the calculated resistances Rs on each phase are fed back into the ASD and used for updating the ASD references, control parameters and/or control settings.

In a preferred embodiment of the invention, the feedback is used to improve the control performance and/or stability of the ASD in operation and/or that the feedback is used for predictive maintenance, to detect faults in cables, motors and/or incorrect installations.

In general, new functionalities may be implemented in connection with the present invention. The new functionalities may include predictive maintenance, wherein weak or loose connections and/or damaged or weak cables of one phase as well as incorrect motor connections may be detected prior to serious malfunctions of the ASD and/or the motor.

Further new functionalities may be implemented in the ASD to support commissioning. Here, the detection of incorrect connections of the motor may be facilitated. This avoids future problems during operation of the motor and potential cable or motor damage.

During commissioning, the ASD may calculate the value of resistances Rs on each phase of the motor and may assess if the differences between the resistances Rs of each phase are too high. Depending on the differences between the resistances Rs the ASD can then send a signal recommending checking the motor and/or cable. All this can be done before running the motor, thus avoiding application issues once the motor is running together with and/or driving further equipment.

Another new functionality, which can be provided with the present invention, is supporting troubleshooting of the motor driven by the ASD. The ASD may monitor and record the resistances Rs on each phase during operation. The recorded resistances Rs may be correlated to situations in which too high torques, speed ripples and/or other motor defects occur, which may be all influenced by an unbalanced resistance.

The invention is also directed at an ASD for executing a method described above. The ASD may comprise any hardware components, which are required for carrying out the above-described methods.

BRIEF DESCRIPTION OF THE DRAWINGS

Further details and advantages of the invention will be described with reference to the following figures.

DETAILED DESCRIPTION

Figure 1:
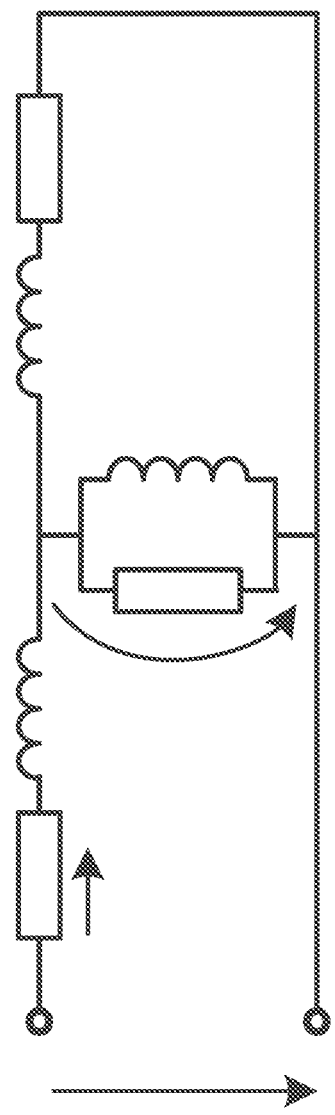
FIG. 1: Electrical one-phase diagram of the induction motor.

Before going into more details of the invention, some background information will be provided on the motors 20 used in the present invention's context. FIG. 1 shows the electrical model of an electric motor 20, such as an induction motor, which is controlled by an adjustable speed drive (ASD) 1, described further below. FIG. 1 shows a one-phase diagram of the electric motor 20, assuming symmetrical components on all three phases of the motor 20, where Rs and Rr are the stator resistances and rotor resistances, respectively, Lls and Llr are the stator leakage inductance and the rotor leakage inductance, respectively, Lm is the magnetizing inductance and Rfe is the equivalent iron loss resistance.

Figure 2:
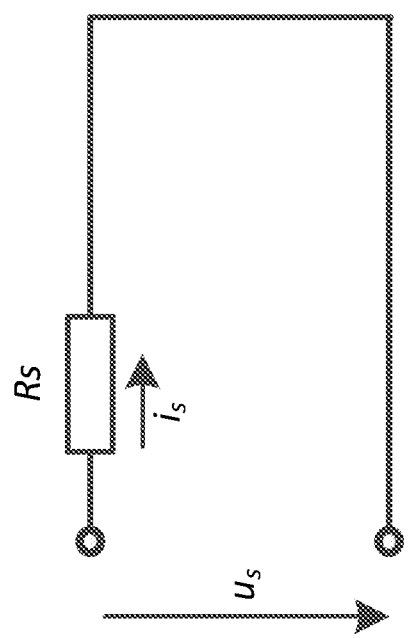
FIG. 2: Electrical one-phase diagram of the induction motor in DC.

The stator voltage equation of the induction machine (electric motor 20) is:

$$u_s(t) = R_s \cdot i_s(t) + \frac{d\psi_s(t)}{dt} \quad \text{(eq. 1)}$$

where
Rs=stator resistance
us=stator voltage applied by the ASD 1
is=stator current source by the ASD 1
$\psi_s$=stator flux When injecting only a DC signal into the machine the derivative of the flux become zero, as given in FIG. 2 and eq. 2.

$$u_s(t) = R_s \cdot i_s(t) \quad \text{(eq. 2)}$$

The impedance of an induction machine to a DC input in steady state seen by the ASD 1 is the $R_{sDC}$ given in eq. 3.

$$R_{sDC} = \frac{u_{sDC}(t)}{i_{sDC}(t)} \quad \text{(eq. 3)}$$

Therefore, if a small DC voltage bias can be superimposed onto the motor supply voltage to inject a DC current component, Rs resistance can be estimated online using the DC components of the determined voltage and current. DC model-based estimation is independent of all motor parameters and is not influenced by inherent motor asymmetry.

In the following paragraphs, more details will be provided on the identification of asymmetry in a given motor 20. Eq 2 given above describes the motor equation assuming a balanced model.

Figure 3:
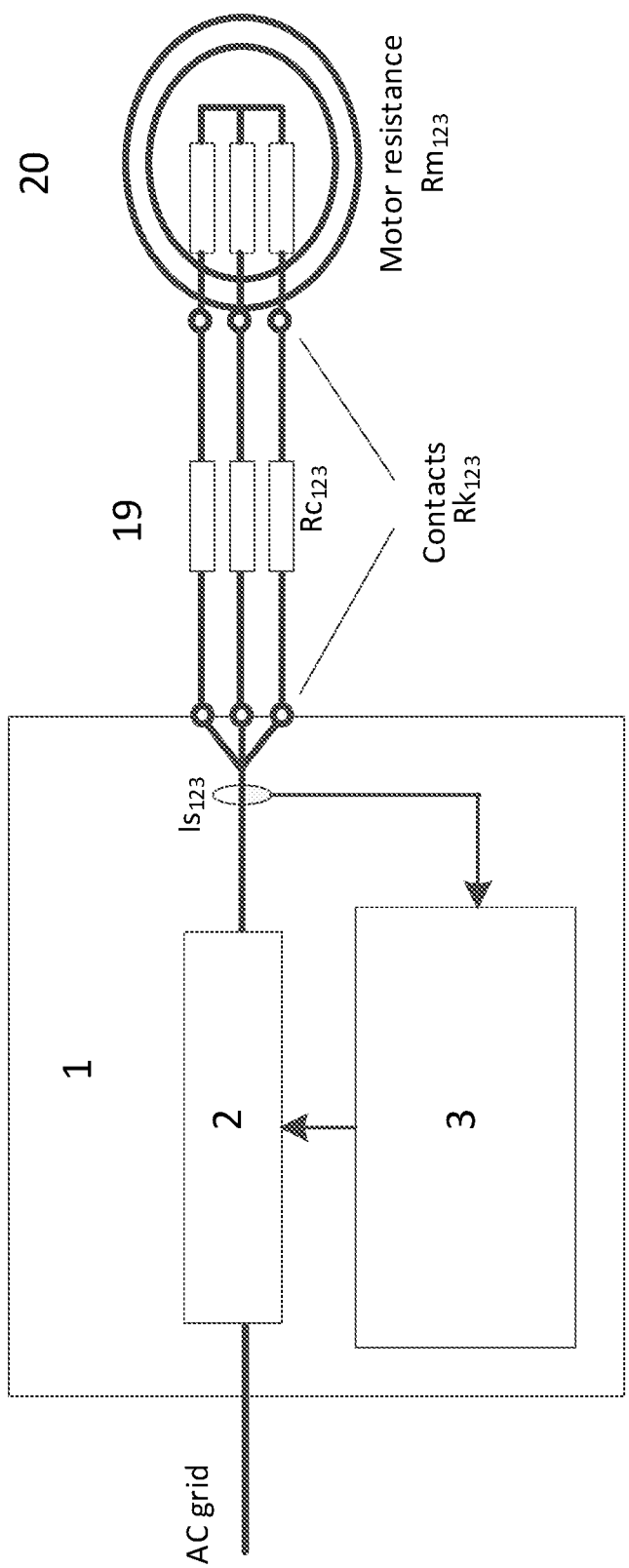
FIG. 3: Simplified electrical diagram of the induction motor, with all three-phase resistors.

In case of parameter unbalance, the equation is described in this form:

$$\begin{cases} u_{s1}(t) = R_{s1} \cdot i_{s1}(t) \\ u_{s2}(t) = R_{s2} \cdot i_{s2}(t) \\ u_{s3}(t) = R_{s3} \cdot i_{s3}(t) \end{cases}$$

where the indexes represent motor phases, as 1 is phase U, 2 is phase V, 3 is phase W and Rs123 represents the cumulated series resistance of the internal ASD contact resistance $Rk_{123}$, the cable resistance $Rc_{123}$ and motor resistance $Rm_{123}$, assuming a DC signal injection approach, as shown in FIG. 3. FIG. 3 is a simplified electrical diagram of the electric motor 20, in particular an induction motor, showing all three phase resistors and their components.

The ASD 1 comprises a power card 2 and a control card 3. The power card 2 may be connected to AC grip power supply and provide electric power to the motor 20. The control card 3 may be used for three voltage estimations for determining above-mentioned voltages $us_{123}$. The control card 3 may further comprise or be connected to three current sensors for determining currents is123. Based on the determined values of currents $is_{123}$ and voltages $us_{123}$, the control card 3 may calculate cumulated resistances $Rs_{123}$ of the corresponding three phases.

Figure 4:
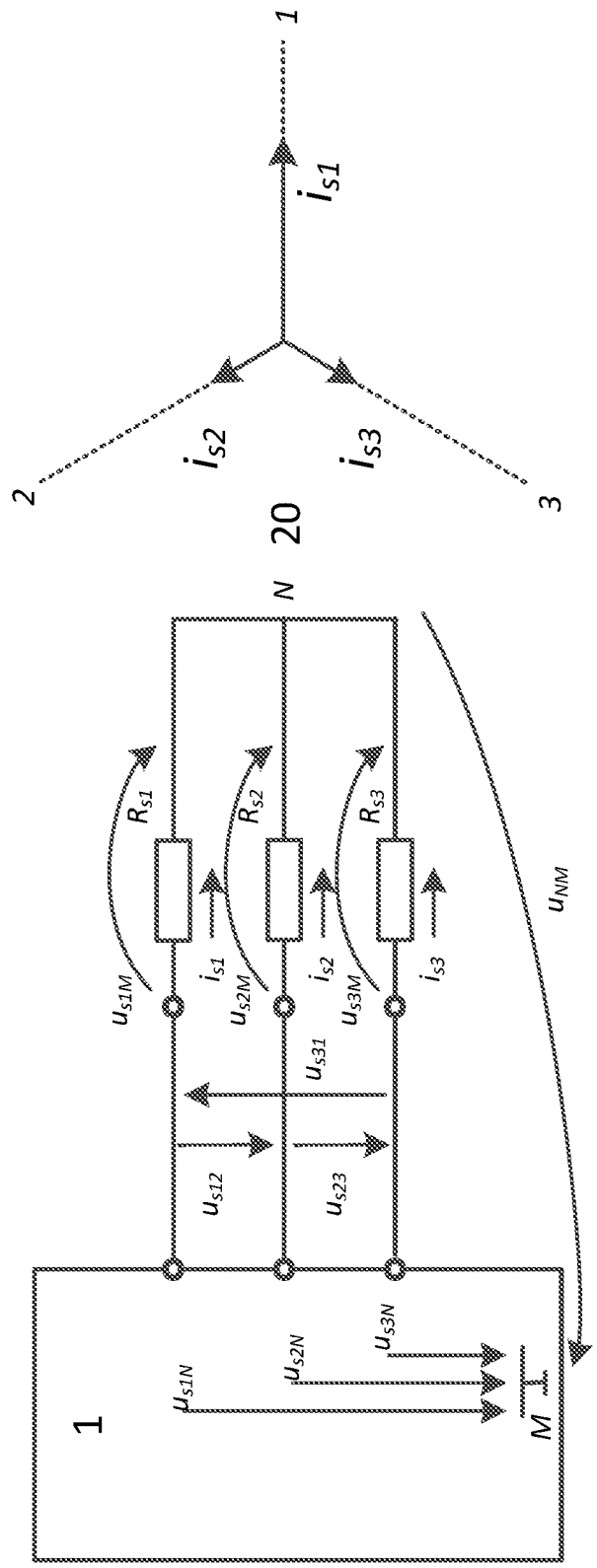
FIG. 4: Electrical diagram of the ASD injecting DC currents into the motor, and space vector representation of the currents.

FIG. 4 shows an electrical diagram of the ASD 1 injecting DC currents into the previously shown motor 20 and a space vector representation of the currents.

Some challenges appear in practice and are indicated in FIG. 4:

The ASD 1 does not have access to the neutral point N of the motor 20, but has its own internal reference point M, thus a common voltage $U_{NM}$ exists between M and N.

There are background DC offsets present on both the voltages and the currents, caused by physical devices, analogue to digital converters, operation amplifiers, etc.

The output voltage system is three phase, three wires, which means there are only two independent equations.

$$\begin{cases} u_{s1M} + u_{offset1} - u_{NM} = R_{s1} \cdot (i_{s1} + i_{offset1}) \\ u_{s2M} + u_{offset2} - u_{NM} = R_{s2} \cdot (i_{s2} + i_{offset2}) \\ u_{s3M} + u_{offset3} - u_{NM} = R_{s3} \cdot (i_{s3} + i_{offset3}) \end{cases} \quad \text{(eq. 4)}$$

The following steps are taken to compensate for the above issues:

Eliminating the offset: this is done by injecting the current in the same direction but with different sign and differentiating the equation.

$$\begin{cases} u_{s1M}^+ - u_{s1M}^- - 2u_{NM} = R_{s1} \cdot (i_{s1M}^+ - i_{s1M}^-) \\ u_{s2M}^+ - u_{s2M}^- - 2u_{NM} = R_{s2} \cdot (i_{s2M}^+ - i_{s2M}^-) \\ u_{s3M}^+ - u_{s3M}^- - 2u_{NM} = R_{s3} \cdot (i_{s3M}^+ - i_{s3M}^-) \end{cases}$$

The result is simplified in this form $$\begin{cases} u_{s1M} - u_{NM} = R_{s1} \cdot i_{s1} \\ u_{s2M} - u_{NM} = R_{s2} \cdot i_{s2} \\ u_{s3M} - u_{NM} = R_{s3} \cdot i_{s3} \end{cases}$$

Eliminating the common mode voltage $U_{NM}$. This is done by differentiating between phases, e.g. 1-2, 2-3, 3-1

$$\begin{cases} u_{s1M} - u_{s2M} = R_{s1} \cdot i_{s1} - R_{s2} \cdot i_{s2} \\ u_{s2M} - u_{s3M} = R_{s2} \cdot i_{s2} - R_{s3} \cdot i_{s3} \\ u_{s3M} - u_{s1M} = R_{s3} \cdot i_{s3} - R_{s1} \cdot i_{s1} \end{cases}$$

The equation is simplified in this form, by noting Rs1, Rs2, Rs3 as x1, x2, x3 to be solved for.

$$\begin{cases} x_1 \cdot i_{s1} - x_2 \cdot i_{s2} = u_{s12} \\ x_2 \cdot i_{s2} - x_3 \cdot i_{s3} = u_{s23} \\ x_3 \cdot i_{s3} - x_1 \cdot i_{s1} = u_{s31} \end{cases}$$

The equation cannot be solved because the known terms (currents and voltages) are not independent:

$$\begin{cases} i_{s1} + i_{s2} + i_{s3} = 0 \\ u_{s12} + u_{is23} + u_{s31} = 0 \end{cases}$$

Figure 5:
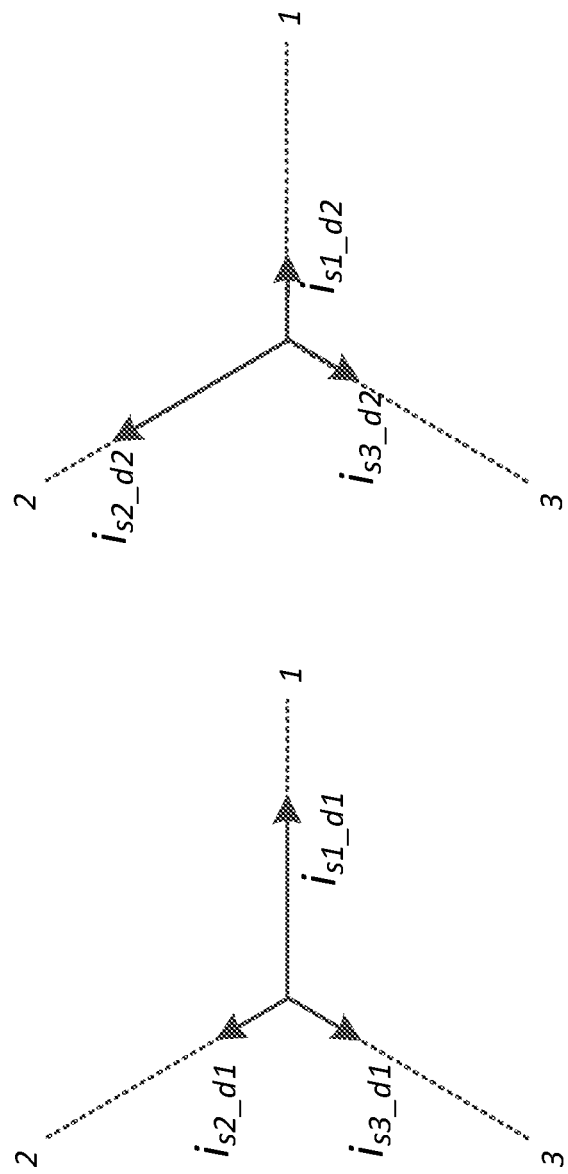
FIG. 5: Space vector representation of injecting DC currents in different directions: a) direction 1, b) direction 2.

Solving the equation by adding more datasets. This is done by injecting currents in a different direction thus collecting more data to compose an independent set of equations that can be solved for unknowns Rs1, Rs2, Rs3. An Illustration is given in FIG. 5 and FIG. 6.

Injection on first direction 1:

$$\begin{cases} x_1 \cdot i_{s1\_d1} - x_2 \cdot i_{s2\_d1} = u_{s12\_d1} \\ x_2 \cdot i_{s2\_d1} - x_3 \cdot i_{s3\_d1} = u_{s23\_d1} \\ x_3 \cdot i_{s3\_d1} - x_1 \cdot i_{s1\_d1} = u_{s31\_d1} \end{cases}$$

Injection on second direction 2:

$$\begin{cases} x_1 \cdot i_{s1\_d2} - x_2 \cdot i_{s2\_d2} = u_{s12\_d2} \\ x_2 \cdot i_{s2\_d2} - x_3 \cdot i_{s3\_d2} = u_{s23\_d2} \\ x_3 \cdot i_{s3\_d2} - x_1 \cdot i_{s1\_d2} = u_{s31\_d2} \end{cases}$$

The equation can be solved using any of these two datasets from different directions. One example is the following, solving for x1 and x2. Similar can be found from different other equations.

$$\begin{cases} x_1 \cdot i_{s1\_d1} - x_2 \cdot i_{s2\_d1} = u_{s12\_d1} \\ x_1 \cdot i_{s1\_d2} - x_2 \cdot i_{s2\_d2} = u_{s12\_d2} \end{cases} \quad \text{(eq. 5)}$$

Having these two datasets from different directions, there are several possibilities to solve for the same unknown x1, x2, x3. Thus, to improve the robustness against numerical errors, one can solve all possible equations for the same solution and average the result at the end.

Additionally, different combinations of directions can be used, for example alternating directions d1 and d2 and solving the Rs1,2,3, then injecting in direction 2 and 3 and solving again for Rs1,2,3.

Figure 6:
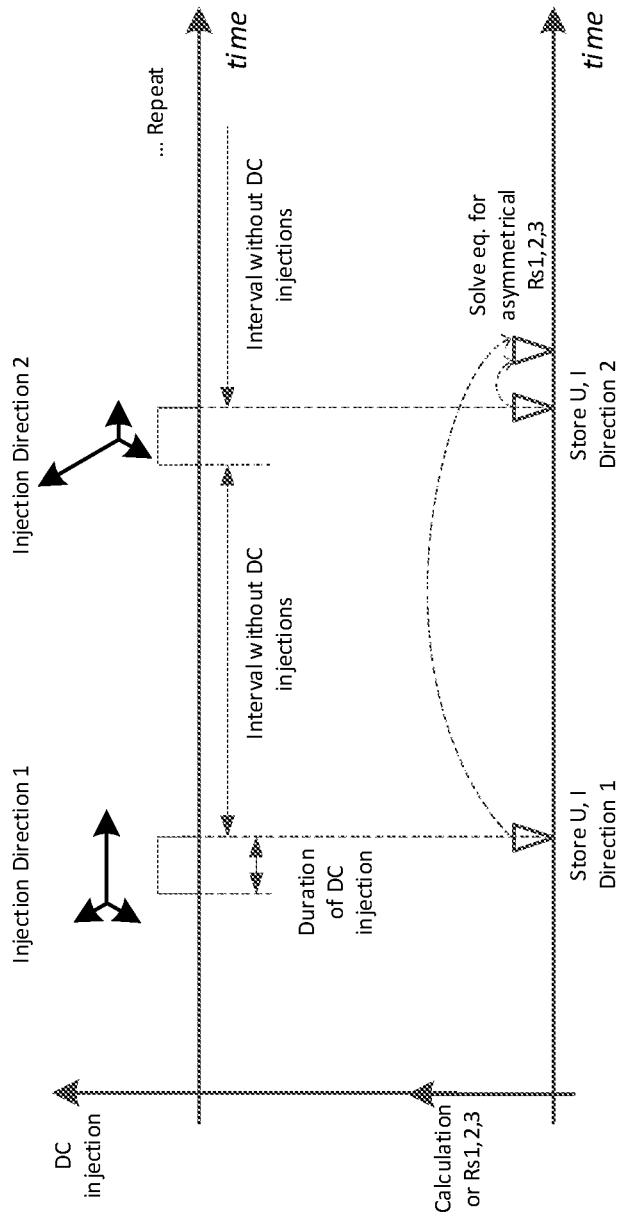
FIG. 6: Illustration of method of injecting DC currents in 2 different directions and solving for the unknown Rs1,2,3 afterwards.

FIG. 6 illustrates a method of injecting DC currents in two different directions and solving for the unknown Rs1,2,3 afterwards.

Figure 7:
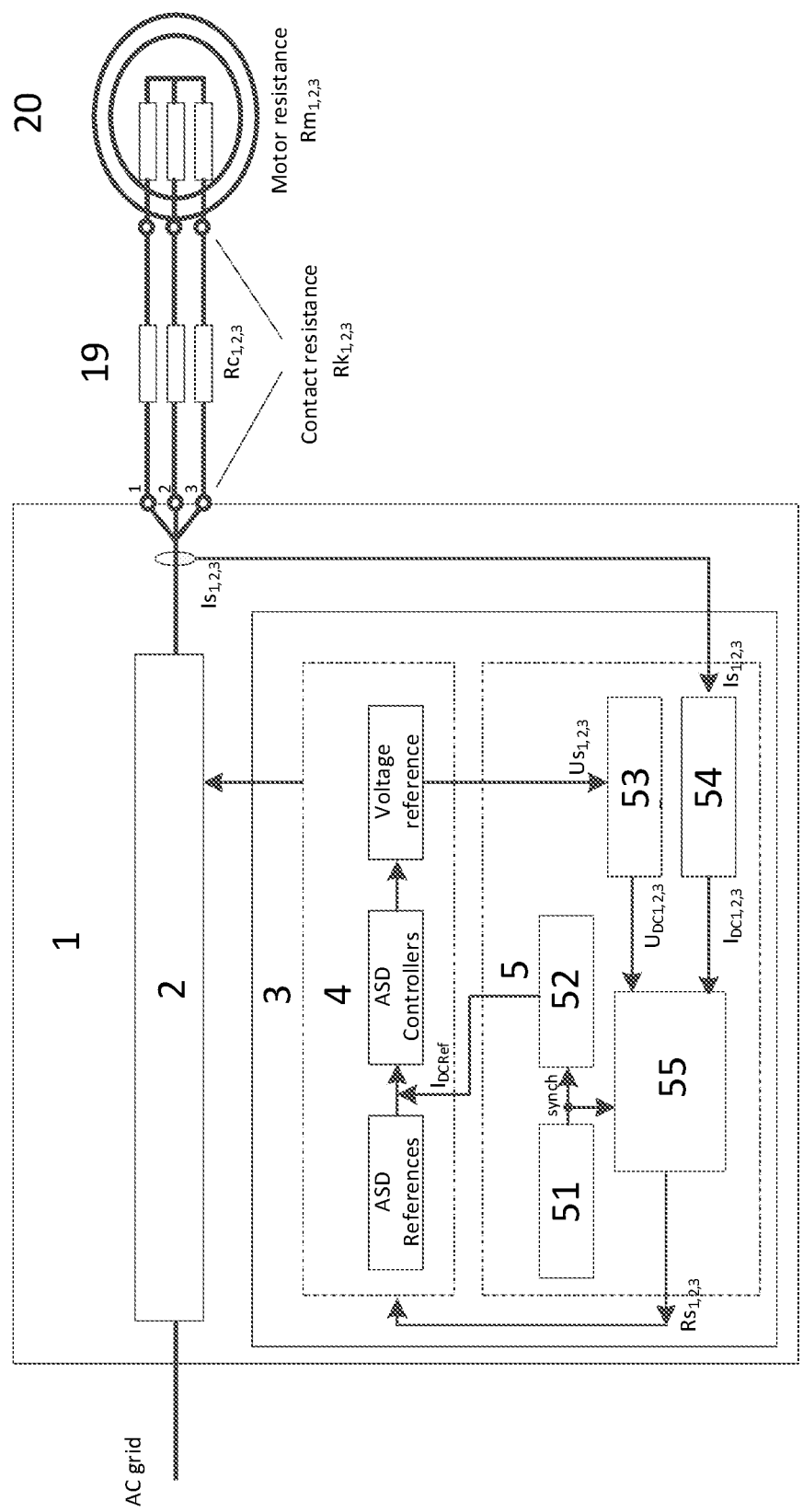
FIG. 7: Main components for calculation of the unsymmetrical DC resistance Rs1,2,3.

FIG. 7 shows the main components of an ASD 1 capable of calculating the asymmetric DC resistance Rs1,2,3 of the motor 20 and its connection 19 with its corresponding cable resistance Rc1,2,3.

The ASD 1 comprises a power card 2 with all hardware required for powering the motor 20 from an AC grid supply. The power card 2 may comprise analogue circuits, digital circuits, power switches.

The ASD 1 further comprises a control card 3, which may comprise all software, control and protection components of the ASD 1. FIG. 7 shows an ASD control unit 4 as a subcomponent of the control card 3. The ASD control unit 4 fulfils the primary function of the ASD 1, i.e. to control the movement of the motor 20. It provides the control of the hardware and all the needed features for motor control.

A second subcomponent of the control card 3 is the Rs estimation block 5. The Rs estimation block 5 may comprise an algorithm implemented in the control card software that receives internal and external signals and calculates the motor connection resistance of each phase Rs1, 2, 3. This information is fed back into the ASD control unit 4 to improve the stability and control performance. In the present invention, the term "block" may relate to a physical component and/or to some software application or calculation process.

Subcomponents of the Rs estimation block 5 comprise an Rs control unit 51, which provides a function responsible for synchronizing (by signal 'synch') the entire process of injecting the DC currents and measuring the effect in the output currents and voltages.

The injection is discontinuous and may occur only for a short period of time. The injection may then be stopped and interrupted for a while until a following DC injection. This approach minimizes the ripple produced in the output motor torque and speed.

This function also estimates the right time to inject the DC current so as to not disturb the system and cause faults and trips. It also checks if the ASD 1 is in steady and stable operation conditions to perform the DC measurement and avoid erroneous results.

The Rs estimating block 5 further comprises means for triggering or injecting the DC current 52, comprising a function that calculates a needed reference $I_{DCRef}$ and sends it to the ASD control unit 4, to produce a DC output current. This function synchronizes the injection with the right phase of the output current to avoid transients and erroneous results.

The Rs estimation block 5 further comprises means for estimating voltages Us123 53 comprising a function that receives the output voltages $U_{s1,2,3}$ from the ASD control unit 4 and after filtering for noise and compensating for the inverter nonlinearities, extracts the DC content out $U_{DC1,2,3}$.

The Rs estimation block 5 further comprises current sensors Is123 54 comprising a function that receives the output currents $I_{s1,2,3}$ from the ASD current sensors and after filtering for noise, it extracts the DC content out $I_{DC1,2,3}$.

Calculation of asymmetrical Rs is performed at calculation block 55, comprising the algorithm of calculating the $R_{s1,2,3}$ by solving the equations eq. 1 to eq. 5 given above.

Figure 8:
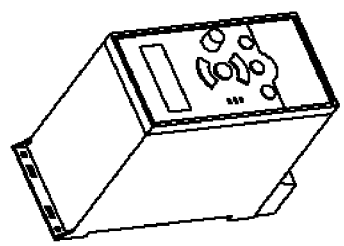
FIG. 8: Simple overview of motor and ASD.
Figure 8:
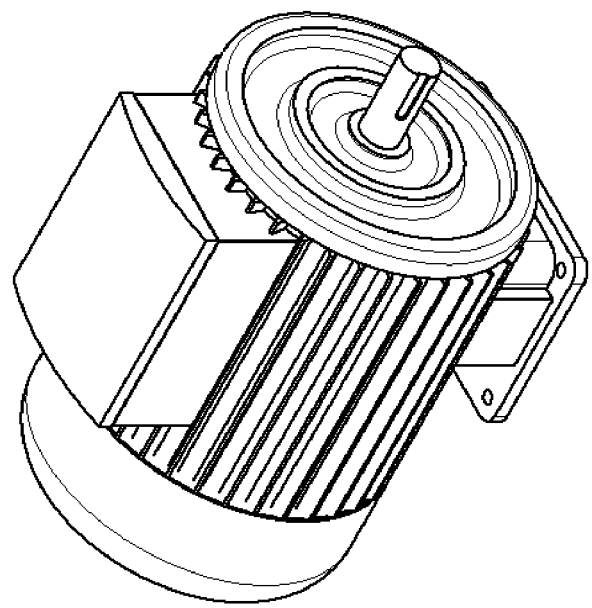

FIG. 8 shows a simple overview of motor 20 and ASD 1.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for estimating individual phase resistance of a motor by means of an adjustable speed drive (ASD), while the motor controlled by the ASD is running and/or is at standstill, wherein the motor is an asynchronous motor or a synchronous motor, the method comprising the steps of:
    injecting at least two DC currents in the motor as an ASD output,
    determining the output voltages and currents resulting from injecting the DC currents,
    extracting DC components present in the determined output voltages and currents, and
    calculating the cumulated output resistance Rs seen by the ASD on each phase of the motor individually,
    wherein the injected DC currents are synchronized with different phase angles of a fundamental output current of the ASD.

2. The method according to claim 1, wherein the determined output voltages and/or currents are either measured or estimated.

3. The method according to claim 2 wherein the injected DC currents are synchronized with different phase angles of a fundamental output current of the ASD.

4. The method according to claim 2 wherein the DC currents are injected in a discontinues manner, for a limited injection period followed by a waiting period until next DC current injection.

5. The method according to claim 2, wherein the injection of the DC current is stopped if the ASD is not in a safe operation conditions.

6. The method according to claim 2 wherein the injection of the DC current is stopped if the ASD operated in excessively dynamic conditions that affect the extraction of the DC components present in the determined output currents and voltages.

7. The method according to claim 1, wherein the DC currents are injected in a discontinues manner, for a limited injection period followed by a waiting period until next DC current injection.

8. The method according to claim 7, wherein the duration of both injection and waiting period may be variable and synchronized with the speed of the motor.

9. The method according to claim 8, wherein the injection of the DC current is stopped if the ASD is not in a safe operation conditions.

10. The method according to claim 7, wherein the injection of the DC current is stopped if the ASD is not in a safe operation conditions.

11. The method according to claim 7 wherein the injection of the DC current is stopped if the ASD operated in excessively dynamic conditions that affect the extraction of the DC components present in the determined output currents and voltages.

12. The method according to claim 1 wherein the injection of the DC current is stopped if the ASD is not in a safe operation conditions.

13. The method according to claim 1 wherein the injection of the DC current is stopped if the ASD operates in excessively dynamic conditions that affect the extraction of the DC components present in the determined output currents and voltages.

14. The method according to claim 1 wherein the calculated resistances Rs on each phase are fed back into the ASD and used for updating the ASD references, control parameters and/or control settings.

15. The method according to claim 14 wherein the feedback is used to improve the control performance and/or stability of the ASD in operation and/or that the feedback is used for predictive maintenance, to detect faults in cables and/or motors, and/or incorrect installations.

16. An adjustable speed drive for executing a method according to claim 1.

17. A method for estimating individual phase resistance of a motor by means of an adjustable speed drive (ASD), while the motor controlled by the ASD is running and/or is at standstill, wherein the motor is an asynchronous motor or a synchronous motor, the method comprising the steps of:
    injecting at least two DC currents in the motor as an ASD output,
    determining the output voltages and currents resulting from injecting the DC currents,
    extracting DC components present in the determined output voltages and currents, and
    calculating the cumulated output resistance Rs seen by the ASD on each phase of the motor individually,
    wherein the DC currents are injected in a discontinues manner, for a limited injection period followed by a waiting period until next DC current injection.

18. The method according to claim 17, wherein the duration of both injection and waiting period may be variable and synchronized with the speed of the motor.

19. A method for estimating individual phase resistance of a motor by means of an adjustable speed drive (ASD), while the motor controlled by the ASD is running and/or is at standstill, wherein the motor is an asynchronous motor or a synchronous motor, the method comprising the steps of:

injecting at least two DC currents in the motor as an ASD output, determining the output voltages and currents resulting from injecting the DC currents, extracting DC components present in the determined output voltages and currents, and calculating the cumulated output resistance Rs seen by the ASD on each phase of the motor individually, wherein the calculated resistances Rs on each phase are fed back into the ASD and used for updating the ASD references, control parameters and/or control settings.

* * * * *